(12) United States Patent
Majeed et al.

(10) Patent No.: US 10,128,123 B2
(45) Date of Patent: Nov. 13, 2018

(54) SUBSTRATE STRUCTURE WITH ARRAY OF MICROMETER SCALE COPPER PILLAR BASED STRUCTURES AND METHOD FOR MANUFACTURING SAME

(71) Applicant: IMEC VZW, Leuven (BE)

(72) Inventors: Bivragh Majeed, Leuven (BE); Philippe Soussan, Wavre (BE)

(73) Assignee: IMEC VZW, Leuven (BE)

( * ) Notice: Subject to any disclaimer, the term of this patent is extended or adjusted under 35 U.S.C. 154(b) by 61 days.

(21) Appl. No.: 15/159,172

(22) Filed: May 19, 2016

(65) Prior Publication Data

US 2016/0343655 A1 Nov. 24, 2016

(30) Foreign Application Priority Data

May 22, 2015 (EP) .................................... 15168993

(51) Int. Cl.
| | |
|---|---|
| *H01L 23/52* | (2006.01) |
| *H01L 21/311* | (2006.01) |
| *H01L 23/532* | (2006.01) |
| *H01L 23/29* | (2006.01) |
| *H01L 23/31* | (2006.01) |
| *H01L 23/00* | (2006.01) |

(52) U.S. Cl.
CPC ........ *H01L 21/31122* (2013.01); *H01L 24/05* (2013.01); *H01L 24/11* (2013.01); *H01L 24/13* (2013.01); *H01L 23/291* (2013.01); *H01L 23/3171* (2013.01); *H01L 23/53238* (2013.01); *H01L 24/03* (2013.01); *H01L 2224/034* (2013.01); *H01L 2224/03009* (2013.01); *H01L 2224/0361* (2013.01); *H01L 2224/03912* (2013.01); *H01L 2224/0401* (2013.01); *H01L 2224/10145* (2013.01); *H01L 2224/11009* (2013.01); *H01L 2224/119* (2013.01); *H01L 2224/1147* (2013.01); *H01L 2224/11462* (2013.01); *H01L 2224/11602* (2013.01); *H01L 2224/13005* (2013.01); *H01L 2224/13007* (2013.01); *H01L 2224/13014* (2013.01); *H01L 2224/13083* (2013.01); *H01L 2224/13109* (2013.01); *H01L 2224/13111* (2013.01); *H01L 2224/13155* (2013.01); *H01L 2224/13157* (2013.01); *H01L 2224/13164* (2013.01); *H01L 2224/14131* (2013.01)

(58) Field of Classification Search
CPC ......... H01L 23/53233; H01L 23/53238; H01L 24/10; H01L 24/13; H01L 24/14; H01L 2224/13014; H01L 2224/13023; H01L 2224/13687; H01L 2224/14131
USPC .......................................................... 257/762
See application file for complete search history.

(56) References Cited

U.S. PATENT DOCUMENTS

2002/0033412 A1* 3/2002 Tung ................. H01L 24/11
228/215
2017/0125335 A1* 5/2017 Michael ............ H01L 23/49838

* cited by examiner

*Primary Examiner* — Matthew E Warren
(74) *Attorney, Agent, or Firm* — Knobbe Martens Olson & Bear, LLP

(57) ABSTRACT

Micro bump interconnection structures for semiconductor devices, and more specifically, a substrate structure comprising an array of micrometer scale copper pillar based structures or micro bumps eventually comprising a solder material and a method for manufacturing the same are provided.

13 Claims, 13 Drawing Sheets

SUBSTRATE STRUCTURE WITH ARRAY OF MICROMETER SCALE COPPER PILLAR BASED STRUCTURES AND METHOD FOR MANUFACTURING SAME

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57. This application claims the benefit of European Application No. EP 15168993.2 filed May 22, 2015. The aforementioned application is incorporated by reference herein in its entirety, and is hereby expressly made a part of this specification.

FIELD OF THE INVENTION

The present description relates generally to the field of micro bump interconnection structures for semiconductor devices and more specifically to a substrate structure comprising an array of micrometer scale copper pillar based structures or micro bumps eventually comprising a solder material and a method for manufacturing the same.

BACKGROUND OF THE INVENTION

As part of the general trend of towards smaller and cheaper interconnect technologies microbump copper pillars are attracting attention in the microelectronic industry for the design of advanced semiconductor circuits with high interconnection densities. Copper pillars show good advantages of better electrical properties and higher stand-off height for underfill processes and smaller bump pitches and hence a higher number of IO counts can be achieved. Several publications about copper pillars with bump pitches in the range of 10 µm till 30 µm can be found, and "Sacrificial ion beam etching process for seed layer removal of 6 µm pitch CuSn micro bumps", by J. Hess et al., IOP Conf. Series: Materials Science and Engineering 41 (2012) 012005, describes the fabrication process of copper pillars with a bump pitch of 6 µm using an ion beam etching (IBE) process for removing the TiW/Cu seed layer without any undercut.

Further, "Microbumping technology for Hybrid IR detectors, 10 µm pitch and beyond", by B. Majeed et al., Electronics Packaging Technology Conference (EPTC), 2014 IEEE 16th, pp 453-457, 3-5 Dec. 2014, shows the feasibility of microbump fabrication processes down to 10 µm and beyond. The micro bumps are based on Cu/Ni/Sn semi additive plating and built at wafer level using a process fully compatible with standard packaging infrastructures. Different test materials with 15, 10 and even 5 µm pitch Sn microbumps were processed.

SUMMARY OF THE INVENTION

There is a motivation to improve current state of the art fabrication processes for fine-pitch micro bump copper pillar arrays in order to obtain better semiconductor interconnection performance.

Accordingly, in a generally applicable first aspect (i.e. independently combinable with any of the aspects or embodiments identified herein), a substrate structure for use in a semiconductor device is provided, comprising: an array of copper pillar structures extending over one or more lines of a first direction and/or one or more lines of a second direction on top of a substrate layer; wherein the copper pillar structures have a substantially cylindrical shape with a width of from 1 µm to 3 µm and a height of from 2 µm to 9 µm and an aspect height/width ratio of from 2 to 3; wherein the copper pillar structures are separated in the first direction and/or the second direction by a pitch, defined from a center of a first pillar structure to a center of a second pillar structure, of from 4 µm to 5 µm; and wherein each copper pillar structure has an oxide layer or a nitride layer on its surface and in contact with its base.

In an embodiment of the first aspect, which is generally applicable (i.e., independently combinable with any of the aspects or embodiments identified herein), the base comprises a first TiW, Ti or TiN layer with a thickness of about 30 nm and a second Cu seed layer with a thickness of about 100 nm.

In an embodiment of the first aspect, which is generally applicable (i.e., independently combinable with any of the aspects or embodiments identified herein), the oxide layer or the nitride layer on a surface of the substrate layer has a thickness of from 100 nm to 300 nm.

In an embodiment of the first aspect, which is generally applicable (i.e., independently combinable with any of the aspects or embodiments identified herein), each copper pillar structure comprises an undercut region at the base which is smaller than 100 nm.

In an embodiment of the first aspect, which is generally applicable (i.e., independently combinable with any of the aspects or embodiments identified herein), each base has a form of an extended base which is wider than a top part of the pillar.

In an embodiment of the first aspect, which is generally applicable (i.e., independently combinable with any of the aspects or embodiments identified herein), a difference in height between the copper pillar structures of the array is less than 0.5 µm.

In an embodiment of the first aspect, which is generally applicable (i.e., independently combinable with any of the aspects or embodiments identified herein), each copper pillar structure further comprises a solder material layer and a barrier material layer, wherein the barrier material layer is situated between the solder material layer and a copper pillar of the copper pillar structure, thereby forming an array of micro bump structures.

In an embodiment of the first aspect, which is generally applicable (i.e., independently combinable with any of the aspects or embodiments identified herein), the solder material layer comprises at least 85% Sn or In, and the barrier material layer is Ni, Co, or Pd.

In an embodiment of the first aspect, which is generally applicable (i.e., independently combinable with any of the aspects or embodiments identified herein), the micro bump structures have a substantially cylindrical or cylindrical-like shape with a width of from 1 µm to 3 µm and a height of from 2 µm to 9 µm and an aspect height/width ratio of from 2 to 3.

In an embodiment of the first aspect, which is generally applicable (i.e., independently combinable with any of the aspects or embodiments identified herein), the copper pillar structures have a height of from 1.5 µm to 7 µm, wherein the barrier material layer has a height of 0.5 µm, and wherein the solder material layer has a height of from 1.5 µm to 7 µm.

In a generally applicable second aspect (i.e. independently combinable with any of the aspects or embodiments identified herein), an integrated circuit, a semiconductor wafer or an electronic device is provided comprising the substrate structure of the first aspect.

In a generally applicable third aspect (i.e. independently combinable with any of the aspects or embodiments identified herein), a method for fabricating a substrate structure for use in a semiconductor device is provided, comprising: depositing, on top of a first oxide layer at a surface of a substrate layer, one or more layers selected from the group consisting of a TiW layer, a Ti layer, and a TiN layer, wherein each of the one or more layers has a thickness of about 30 nm; depositing, on top of the one or more layers, a Cu seed layer with a thickness of about 100 nm; depositing a second oxide layer on top of the Cu seed layer; performing a resist processing with an I-line resist comprising an array of cylindrical-like shape recessed areas configured to form an array of copper pillar structures or micro bump structures; performing a dry etching of the second oxide layer in the cylindrical-like shape recessed areas of the I-line resist to create openings for the copper pillar structures or micro bump structures; performing a plating to form an array of copper pillar structures or micro bump structures; performing a wet strip of the I-line resist; performing a dry etch to remove a remaining oxide of the second oxide layer; and performing a wet seed etch to remove the Cu seed layer and the one or more layers around a base and between the pillar structures or micro bump structures.

In an embodiment of the third aspect, which is generally applicable (i.e., independently combinable with any of the aspects or embodiments identified herein), the method further comprises performing a chemical mechanical polishing to reduce the array of copper pillar structures or micro bump structures to a desired height, defined by a top surface of the I-line resist.

In an embodiment of the third aspect, which is generally applicable (i.e., independently combinable with any of the aspects or embodiments identified herein), the method further comprises: after the dry etch to remove the remaining oxide of the second oxide layer, coating a second resist on top of the array of copper pillar structures or micro bump structures to cover them; performing a wet seed etch to remove the Cu seed layer and the one or more layers around the base and between the copper pillar structures or micro bump structures covered by the second resist; and performing a wet strip of the second resist, thereby forming an array of copper pillar structures or micro bump structures comprising an extended base.

Any of the features of an embodiment of the first through third aspects is applicable to all aspects and embodiments identified herein. Moreover, any of the features of an embodiment of the first through third aspects is independently combinable, partly or wholly with other embodiments described herein in any way, e.g., one, two, or three or more embodiments may be combinable in whole or in part. Further, any of the features of an embodiment of the first through third aspects may be made optional to other aspects or embodiments. Any aspect or embodiment of a method can be performed in manufacturing a structure of another aspect or embodiment, and any aspect or embodiment of a structure can be incorporated into a method of another aspect or embodiment.

BRIEF DESCRIPTION OF THE DRAWINGS

The above and other aspects of the substrate and fabrication method according to the present description will be shown and explained with reference to the non-restrictive example embodiments described hereinafter.

DETAILED DESCRIPTION OF THE PREFERRED EMBODIMENT

In the following, in the description of exemplary embodiments, various features may be grouped together in a single embodiment, figure, or description thereof for the purpose of streamlining the disclosure and aiding in the understanding of one or more of the various inventive aspects. This is however not to be interpreted as the invention requiring more features than the ones expressly recited in the independent claims. Furthermore, combinations of features of different embodiments and obvious known alternative structural means are meant to be within the scope of the present description, as would be clearly understood and derived by those skilled in the art at the time of the invention. Additionally, in some examples, well-known methods, structures and techniques have not been shown in detail in order not to obscure the conciseness of the description. When layers are shown, the figures shall not be understood as showing the real scale and thicknesses of those layers since they may be represented out of scale for clarity reasons and the real width, height or thickness or ranges of the same shall be found in the corresponding explanatory text.

Figure 1:
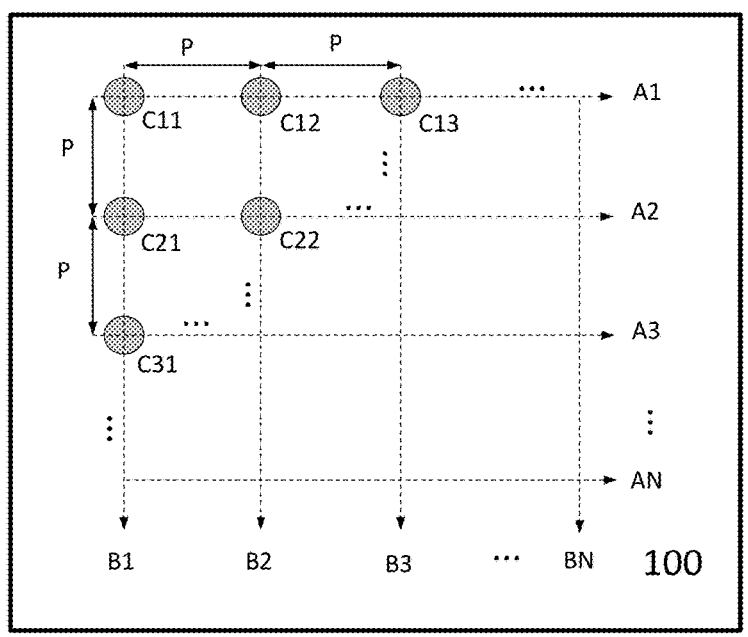
FIG. 1 shows a top view of an exemplary substrate comprising an array of micrometer copper pillar structures.

FIG. 1 shows a top view of an exemplary substrate structure 200 comprising an array of micrometer copper pillar structures C11, C12, C13, C21, C22, C31 (CNM) on top of a substrate layer 100. It will be understood that the array may contain further micrometer copper pillar structures CNM which extend over one or more lines A1 to AN of a first direction and/or one or more lines B1 to BN of a second direction on the substrate. It will be also understood that the substrate structure 200 may represent a die in a wafer or a wafer comprising a plurality of dies. According to an embodiment, the micrometer copper pillar structures CNM are located on top of the substrate layer 100 and are separated by a pitch P defined between the center of a first pillar structure and the center of a second pillar structure in the directions A1 to AN and/or B1 to BN.

According to an exemplary embodiment, the substrate layer 100 is made of a silicon (Si) layer material. According to another exemplary embodiment the substrate layer 100 may comprise a full CMOS stack between the micrometer copper pillars CNM and the Si layer material. Said CMOS stack may be finished with an oxide or nitride layer which is in contact with the micrometer copper pillars. According to another exemplary embodiment the substrate layer 100 may further comprise an oxide or nitride layer on its surface between the silicon and the micrometer copper pillars. According to an embodiment, the micrometer copper pillar structures CNM are made of a material comprising copper (Cu) at their base. Also according to an exemplary embodiment, the micrometer copper pillar structures CNM of the array have a cylindrical shape or a substantially cylindrical-like shape. Advantageously, the cylindrical-like shape withstands better stress and reflow which may tend to make a sphere shape afterwards.

Figure 2:
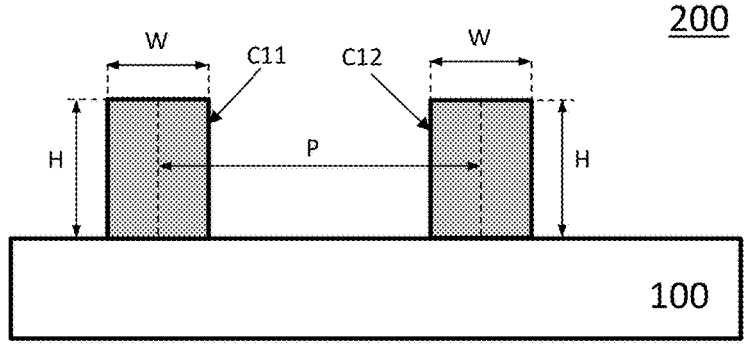
FIG. 2 shows a side view of a substrate comprising two copper pillars structures according to an exemplary embodiment.

FIG. 2 shows a side view of a substrate structure 200 comprising two micrometer copper pillar structures C11 and C12 separated by a pitch P on top of the substrate layer 100 according to an exemplary embodiment.

According to an exemplary embodiment, the micrometer copper pillar structures CNM of the array have a diameter W in the range between 1 and 3 µm and a height H in the range between 2 and 9 µm, and an aspect ratio H/W in the range between 2 and 3. Advantageously, the array of micrometer copper pillars across the die or wafer presents a high aspect ratio.

According to an exemplary embodiment, the pitch P between the micrometer copper pillar structures CNM of the array lies in the range between 4 and 5 µm. According to an exemplary embodiment, the difference in height H between the micrometer copper pillar structures CNM of the array is less than 0.5 µm. Advantageously, the height uniformity of the array of micrometer copper pillars across the die or wafer is improved.

Figure 3A:
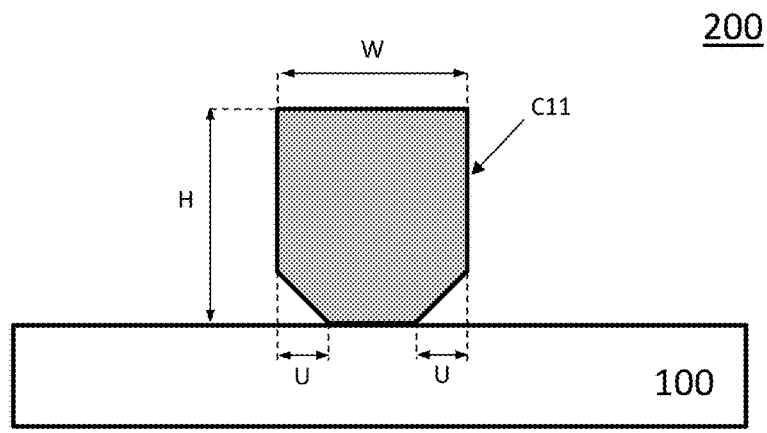
FIGS. 3A and 3B show a side view of a substrate comprising a micrometer copper pillar structure with and without undercut region according to exemplary embodiments.

FIG. 3A shows a side view of a substrate structure 200 comprising a micrometer copper pillar structure C11 with an undercut region U at the base of the pillar according to an exemplary embodiment.

According to an exemplary embodiment, the undercut region U of the micrometer copper pillar structures CNM of the array is smaller than 100 nm.

Figure 3B:
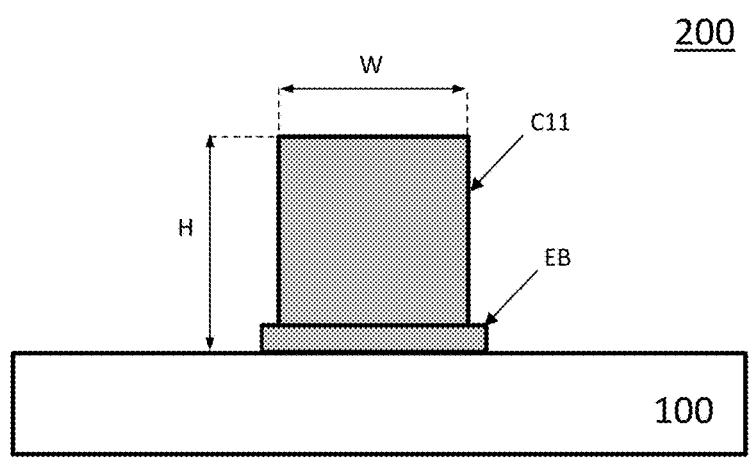

FIG. 3B shows a side view of a substrate structure 200 comprising a micrometer copper pillar structure C11 with no undercut region according to an exemplary embodiment. According to an exemplary embodiment, the micrometer copper pillar structures CNM of the array comprise an extended base EB which is wider than the top part of the pillar.

Figure 4:
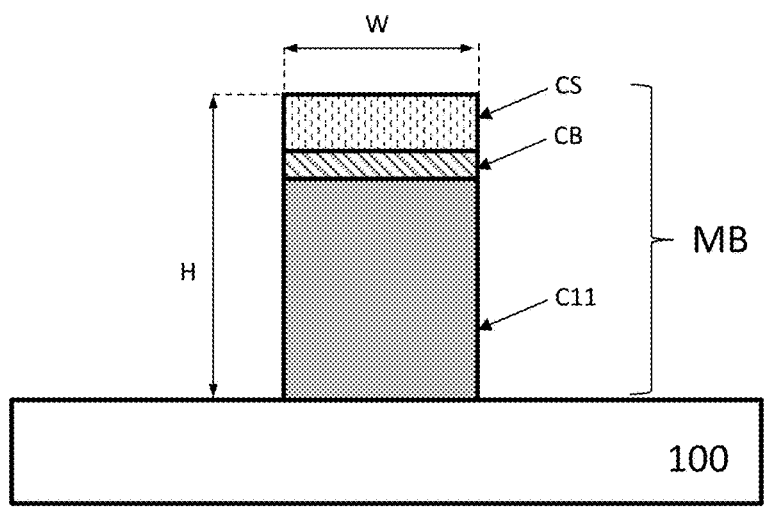
FIG. 4 shows a side view of a substrate comprising a micrometer copper pillar structure with a barrier and a solder material layer according to an exemplary embodiment.

FIG. 4 shows another side view of a substrate structure 200 comprising a micrometer copper pillar structure C11 with a solder material layer CS and a barrier material layer CB between solder material layer CS and the copper pillar C11 according to an exemplary embodiment, and this structure further referred in the following description as a micro bump structure MB.

According to an exemplary embodiment, the solder material layer CS of the array of micro bump structures MB is made by a minimum 85% amount of tin (Sn) or indium (In). Other material such as Ag, Cu, Co can be added to the solder to modify their bonding and reliability properties. According to an exemplary embodiment, the barrier material layer CB of the array of micro bump structures MB is made of nickel (Ni), Cobalt (Co) or Palladium (Pd). According to an exemplary embodiment, the micro bump structures MB of the array have a diameter W in the range between 1 and 3 µm and a height H in the range between 2 and 9 µm, and an aspect ratio H/W in the range between 2 and 3. Advantageously, the array of micro bump structures MB across the die or wafer presents a high aspect ratio.

According to an exemplary embodiment, the micrometer copper pillar structures CNM of the array of micro bump structures MB have a height in the range between 1.5 and 7 µm. According to an exemplary embodiment, the barrier material layer CB of the array of micro bump structures MB has a height of 0.5 µm. According to an exemplary embodiment, the solder material layer CS of the array of micro bump structures MB has a height in the range between 1.5 and 7 µm.

Figure 5:
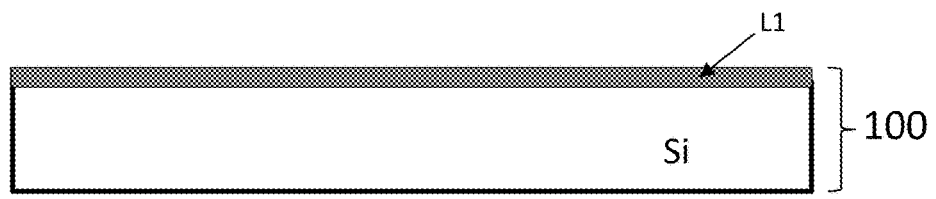
FIG. 5 shows an exemplary embodiment of a substrate comprising a silicon layer and a first oxide layer on the top surface of the substrate according to an exemplary embodiment.

FIG. 5 illustrates an exemplary embodiment of a substrate layer 100 comprising a Si layer and a first oxide layer L1 on the top surface of the substrate layer. According to an exemplary embodiment, the first oxide layer L1 has a thickness in the range between 100 and 300 nm. The first oxide layer L1 may be part of a standard CMOS stack or may be deposited on top of the substrate by chemical vapor deposition (CVD).

Figure 6:
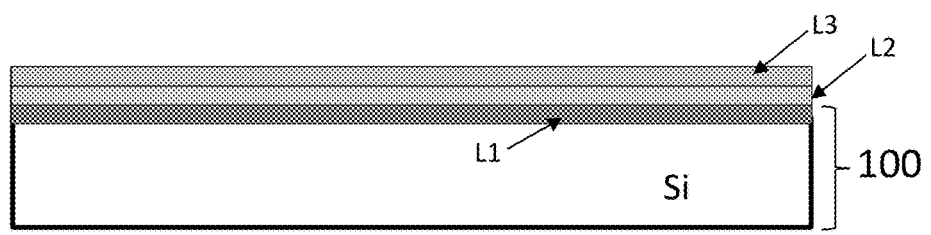
FIG. 6 shows a deposition step of a TiW layer and a Cu seed layer on top of the first oxide layer according to an exemplary embodiment.

FIG. 6 illustrates a deposition step of two further layers on top of the first oxide layer L1, namely a TiW layer L2 with a thickness of about 30 nm and a Cu seed layer L3 with a thickness of about 100 nm. Layer L2 might be as well made of Ti, or TiN, or a combination thereof. According to an embodiment, the thickness of this copper seed layer helps in reducing the undercut region U of the array of copper pillars or micro bumps. It is noted that if the thickness of the Cu seed layer L3 is further reduced, it may result in an increase of the non-uniformity of the array of copper pillars or micro bumps. On the other hand, by further increasing the thickness of the Cu seed layer L3, the undercut region U is increased.

Figure 7:
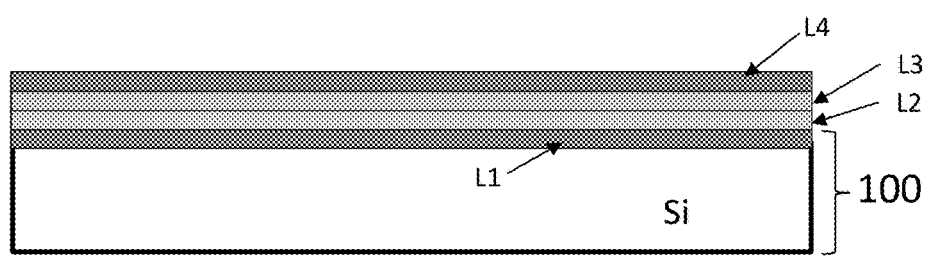
FIG. 7 shows a deposition step of a second oxide layer according to an exemplary embodiment.

FIG. 7 illustrates a deposition step of a second oxide layer L4 on top of the Cu seed layer L3. According to an exemplary embodiment, the second oxide layer L4 may be deposited using a CVD technique and at a temperature lower than 200C, which advantageously does not corrode the copper. The second oxide layer L4 may have thickness in the range between 40 and 60 nm. Advantageously, according to an embodiment, the second oxide layer L4 may be used as a protection layer during seed etch in subsequent steps.

Figure 8:
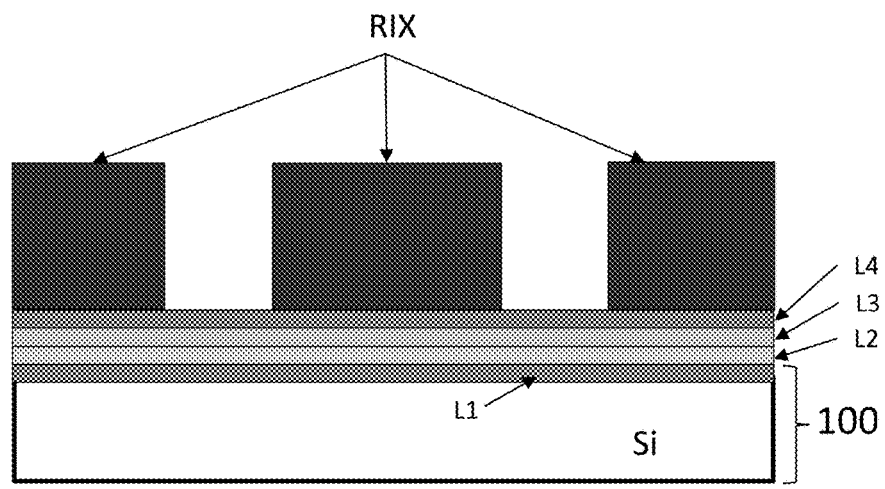
FIG. 8 shows a resist patterning step using an I-line resist according to an exemplary embodiment.

FIG. 8 illustrates a resist processing step arranged for the formation of the array of micrometer copper pillars CNM or micro bumps MB. According to an embodiment, an I-line resist RIX comprising an array of cylindrical shape recessed areas configured for the formation of the array of micrometer copper pillar structures CNM or micro bump structures MB may be used with a standard exposure and development process. Advantageously, the I-line resist RIX is specifically arranged and configured for allowing the formation of very fine pitch micrometer copper pillar CNM and micro bump structures MB.

Figure 9:
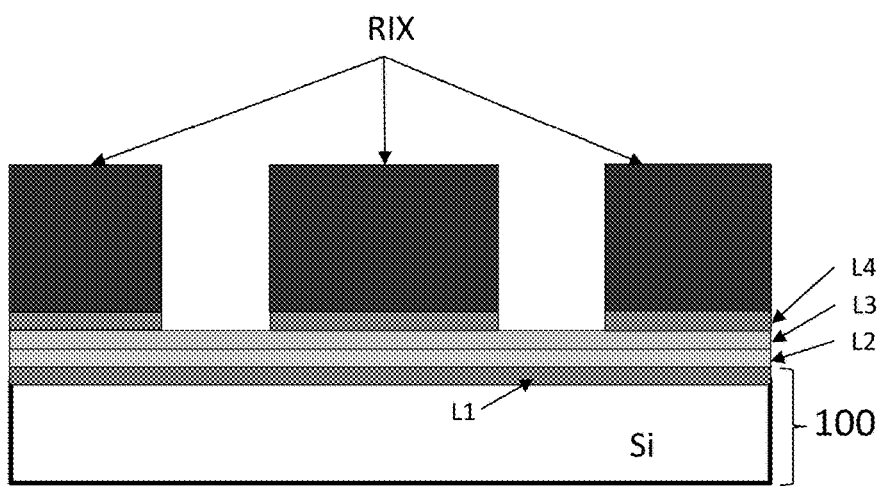
FIG. 9 shows a dry etching step of the second oxide layer in the recessed areas of the I-line resist according to an exemplary embodiment.

FIG. 9 illustrates a dry etching step of the second oxide layer L4 in the recessed areas of the I-line resist RIX to create an opening for the copper pillar structures CNM or micro bump structures MB. A standard dry etching recipe may be used to etch thin oxide selective to Cu seed layer.

Figure 10A:
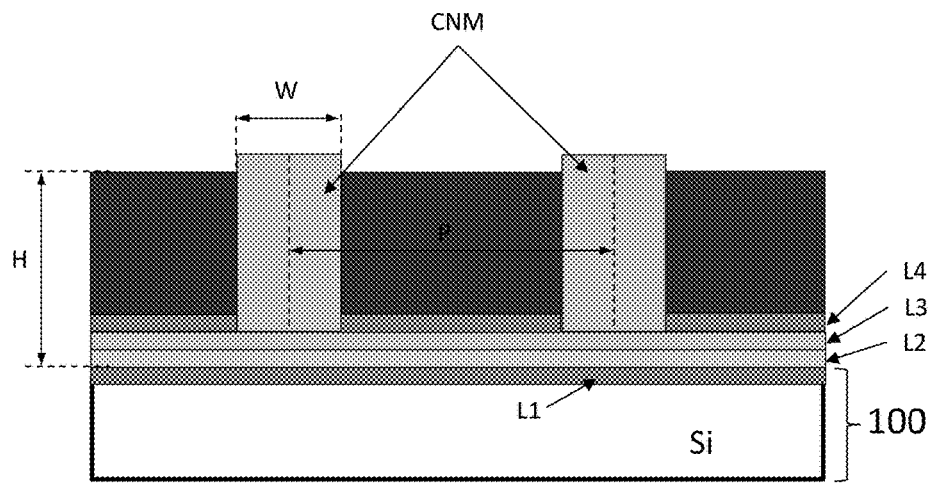
FIGS. 10A and 10B show a plating step of an array of micrometer pillar structures or micro bumps according to exemplary embodiments.

FIG. 10A illustrates an exemplary plating step for the formation of an array of micrometer copper pillar structures CNM as for example shown in FIG. 2. The copper pillars may be formed by electroplating using standard chemistries.

Figure 10B:
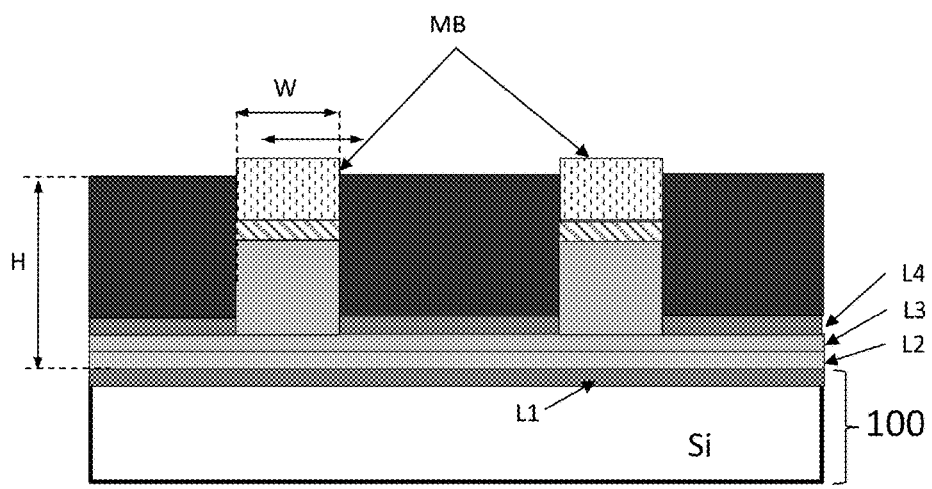

FIG. 10B illustrates an exemplary plating step for the formation of an array of micro bump structures MB as for example shown in FIG. 4. The micro bumps may be formed by electroplating using standard chemistries.

Figure 11A:
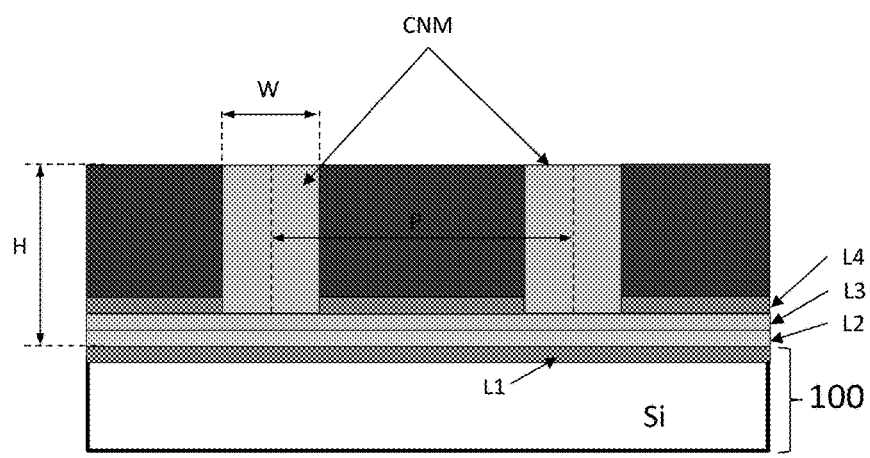
FIGS. 11A and 11B show a chemical mechanical polishing step of an array of micrometer pillar structures or micro bumps according to exemplary embodiments.
Figure 11B:
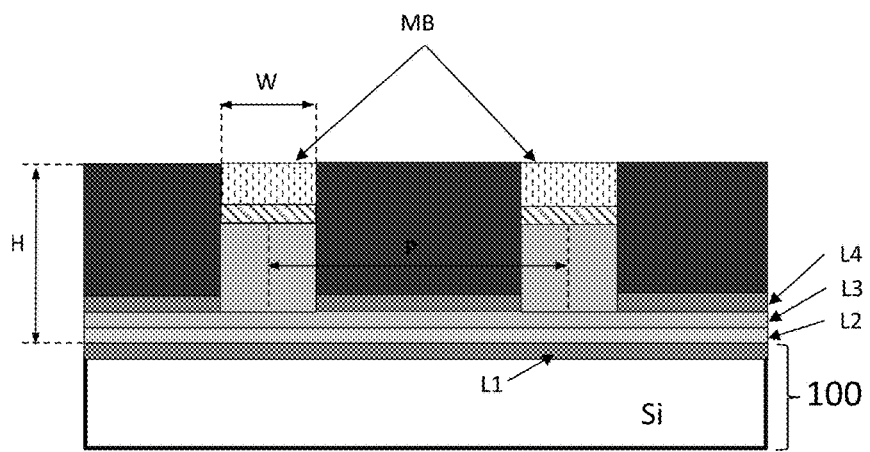

FIGS. 11A and 11B illustrate a chemical mechanical polishing (CMP) step to reduce the array of copper pillar structures CNM or micro bump structures MB to the desired height H defined by the top surface of the I-line resist RIX. The CMP is done selective to the resist in order to planarize the array of copper pillar structures CNM or micro bump structures MB. Advantageously, this step increases the height uniformity of the array across the die or wafer by minimizing the copper pillar or micro bump height H variation.

Figure 12A:
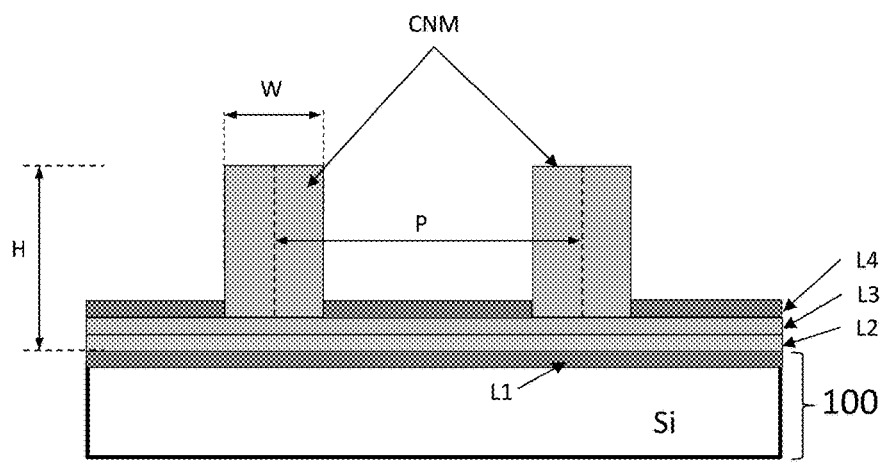
FIGS. 12A and 12B show a wet strip step of a resist according to exemplary embodiments.
Figure 12B:
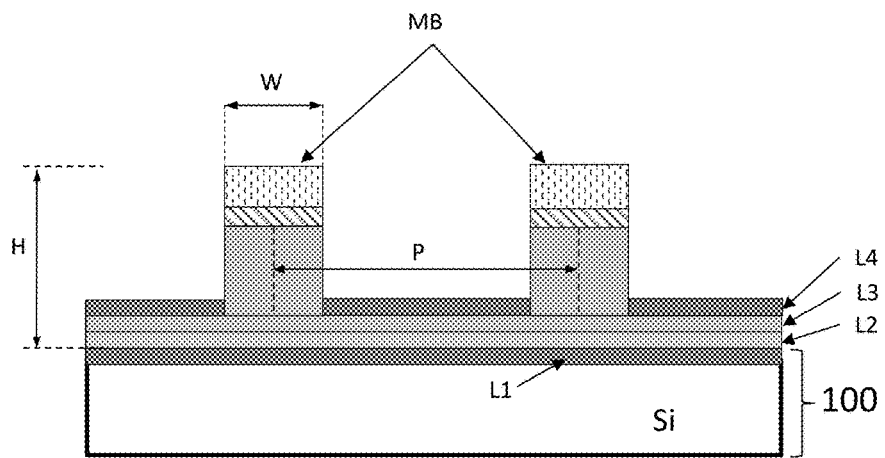

FIGS. 12A and 12B illustrate a wet strip step of the I-line resist. A standard wet strip process may be used.

Figure 13A:
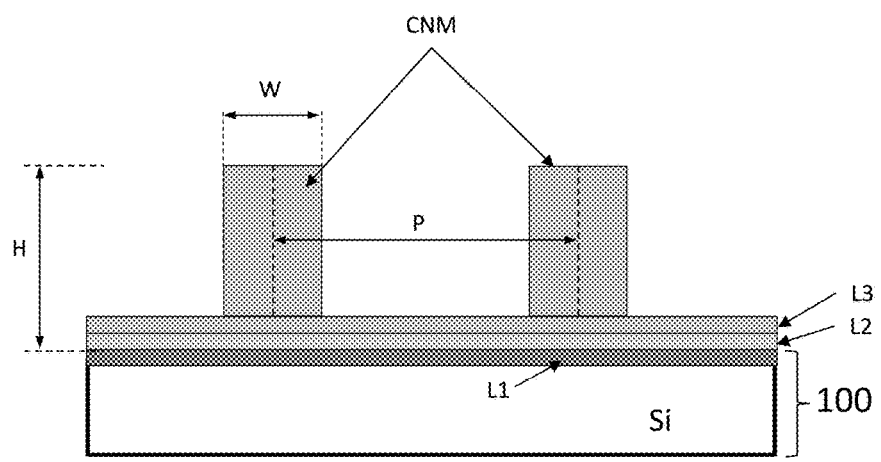
FIGS. 13A and 13B show a dry etch step of a second oxide layer according to exemplary embodiments.
Figure 13B:
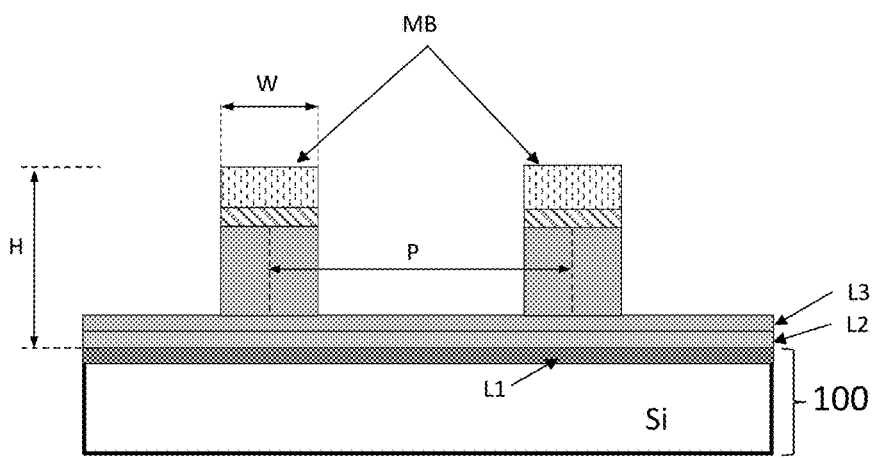

FIGS. 13A and 13B illustrate a dry etch step for removing the remaining oxide of the second oxide layer L4. According to an embodiment, the dry etch advantageously may add passivation on the copper pillar or micro bum structures and reduce the undercut region.

Figure 14A:
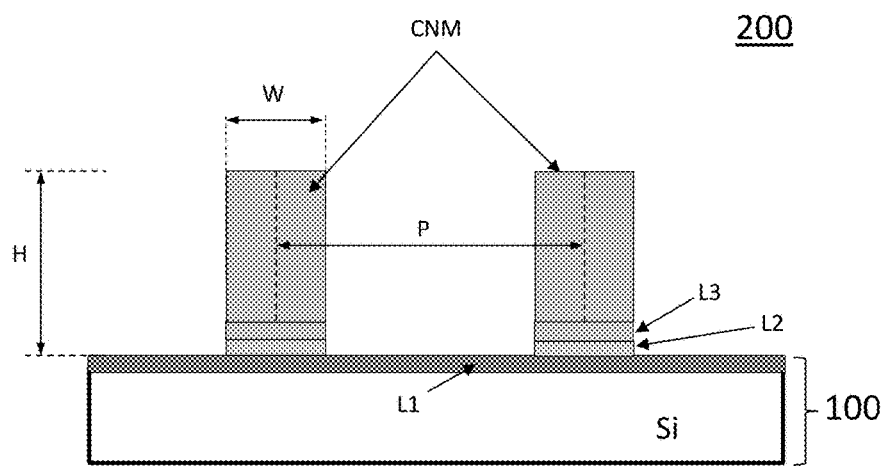
FIGS. 14A and 14B show a final formation of micrometer pillar structures or micro bumps according to exemplary embodiments.
Figure 14B:
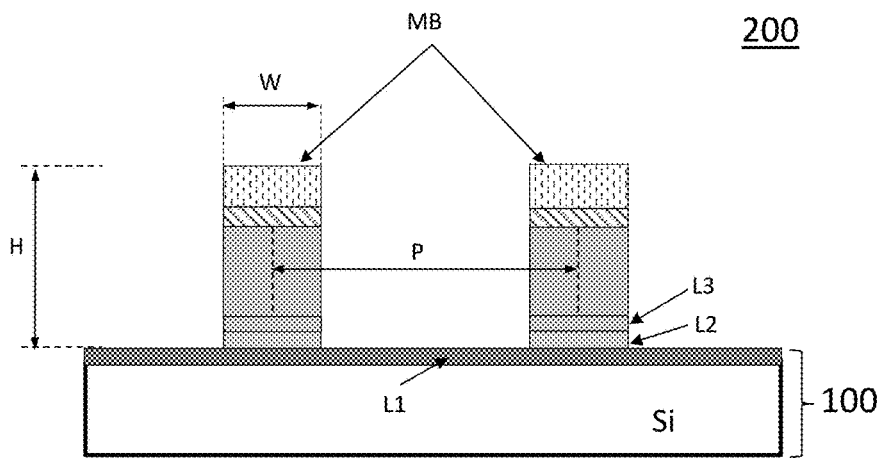

FIGS. 14A and 14B illustrate a wet seed etch step for removing the Cu seed layer L3 and TiW layer L2 around the base and between the micrometer pillar structures CNM or micro bump structures MB. After this step we obtain an array of micrometer pillar structures CNM as shown for example in FIG. 2 or 3A, or an array of micro bump structures MB as shown for example in FIG. 4.

Figure 15A:
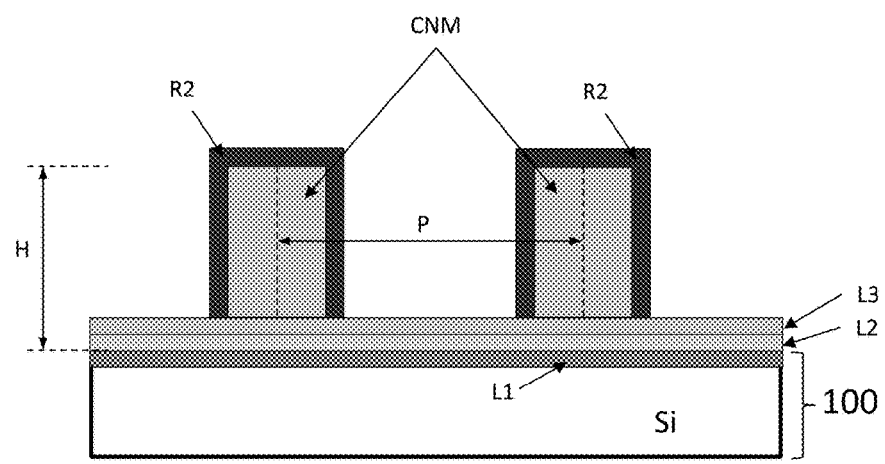
FIGS. 15A and 15B show alternative embodiments following the step of FIGS. 13A and 13B in which the micrometer pillar structures or micro bumps are covered with a resist according to exemplary embodiments.
Figure 15B:
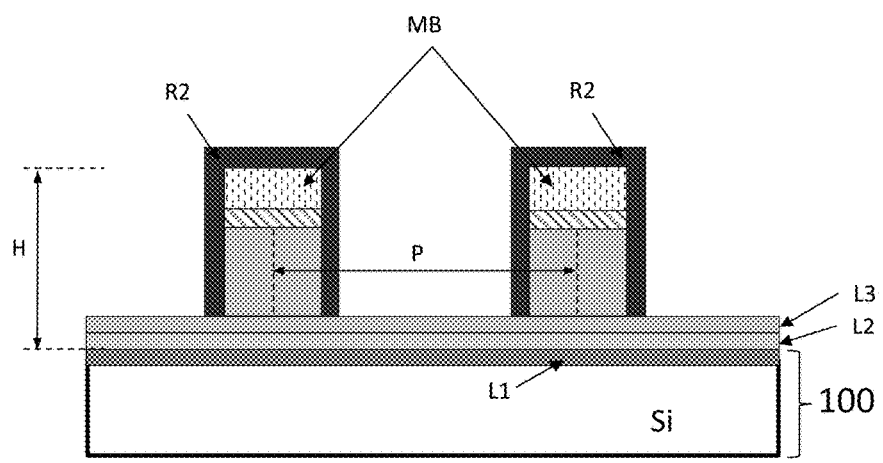
Figure 16A:
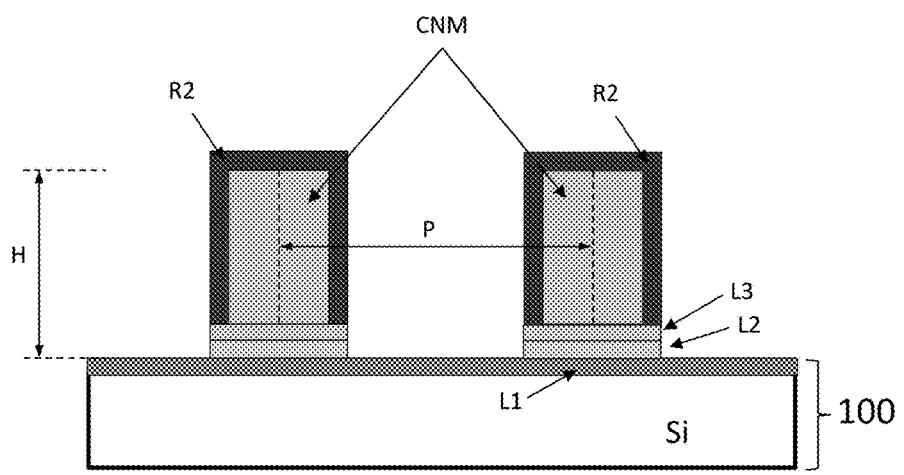
FIGS. 16A and 16B show an etch step of the seed layer around and between the micrometer pillar structures or micro bumps covered by a resist according to exemplary embodiments.
Figure 16B:
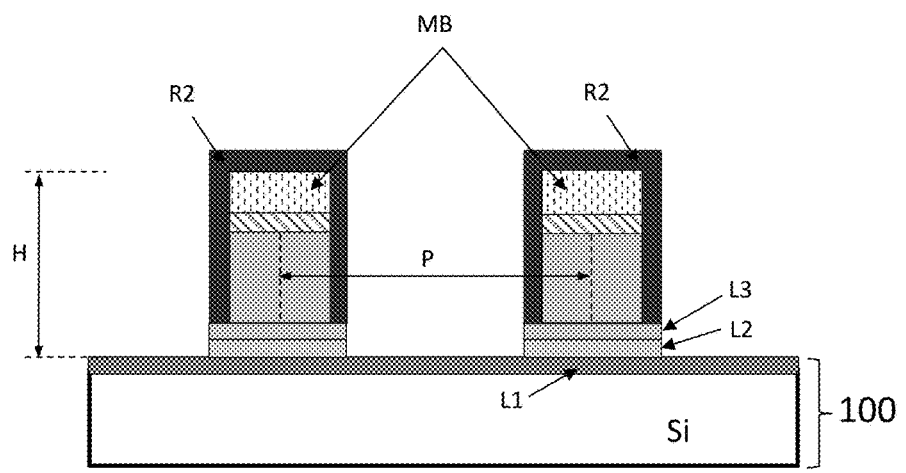
Figure 17A:
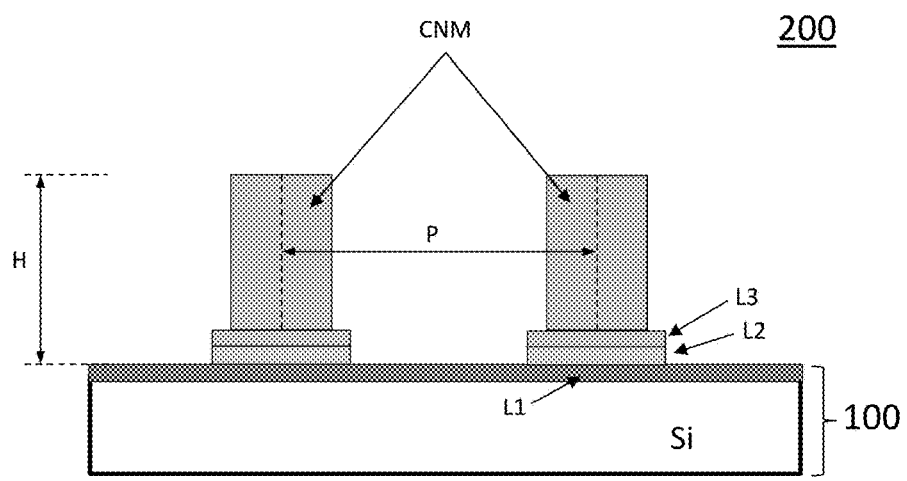
FIGS. 17A and 17B show a final formation of micrometer pillar structures or micro bumps when the resist is removed according to exemplary embodiments.
Figure 17B:
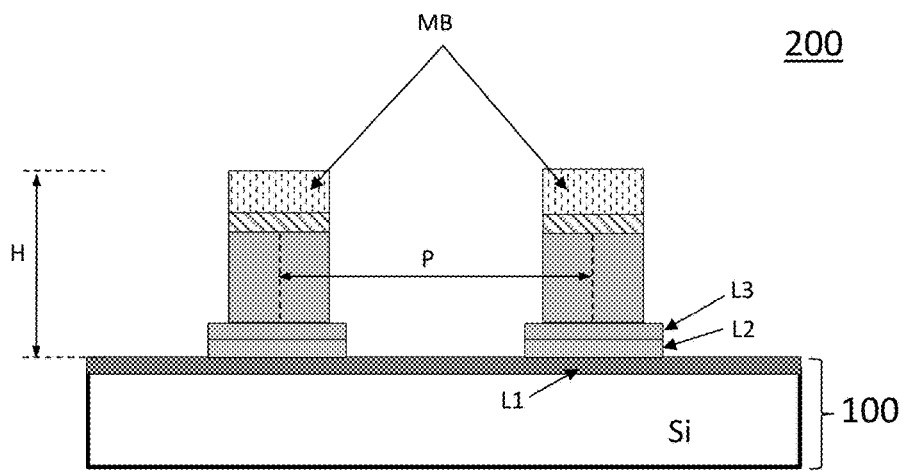

According to an exemplary embodiment, FIGS. 15A and 15B illustrate an alternative step after the dry etch step for removing the remaining oxide of the second oxide layer L4 as shown in FIGS. 13A and 13B. In this step a second resist R2 is coated on top of the array of copper pillar structures CNM or micro bump structures MB such that it covers them. Then FIGS. 16A and 16B illustrate a wet seed etch step for removing the Cu seed layer L3 and TiW layer L2 around the base and between the micrometer pillar structures CNM or micro bump structures MB covered by the resist R2. Then finally, FIGS. 17A and 17B illustrate a wet strip step of the resist R2 and thereby the exposure of the array of micrometer pillar structures CNM or micro bump structures MB comprising an extended base EB as shown for example in FIG. 3B. Advantageously, the array of micrometer pillar structures CNM or micro bump structures MB as such fabricated do not present an undercut region.

Further exemplary embodiments for fabricating a substrate with an array of micrometer pillar structures or micro bump structures will be described in the following: different applications that make use of micro bumps include 3D integration process applications and hybrid imagers. Arrays of micro bumps are of particular interest for hybrid imagers which rely on the bumping of Read Out Integrated Circuit (ROIC) wafers prior to hybridization. Hybrid detectors rely on the heterogeneous stacking of silicon (Si) Read Out Integrated Circuit (ROIC) and other narrow band gap materials sensitive in the infrared wavelengths. Such components are susceptible to operate at cryogenic temperature and the dissimilar Coefficient of Thermal Expansion (CTE) are extremely challenging for the assembly and for the reliability of the component. In order to achieve a higher spatial resolution, the number of pixel needs to be increased. According to one embodiment, a substrate with an array of microbumps consisting of copper (Cu) pillars, a nickel (Ni) barrier layer and a tin (Sn) finish, for pitches inferior to 10 µm may be fabricated. Sn based microbumps have been reported to have electromigration (EM) lifetimes similar to or greater than low melting point bumps such as PbSn and are suited for fine pitch scaling. As pitch decreases, the challenge upon assembly is to providing enough compliance to obtain proper yield of the interconnects. For smaller pitches below 15 µm, seed removal becomes challenging as well due to higher undercut with wet processes. There have been studies to reduce the undercut using ion beam etching processing, however the process suffered from an incoherent tin layer with a crown formation around the top surface. In another approach electroless Ni/Au is plated on already formed Al bumps to reduce the undercut. However, the use of gold close to the ROIC and at narrow gap can be problematic. It has been reported, possibly prematurely, that below 15 µm pitch it is not possible to use wet etch processes due to high undercut. In the present description we report on the process with reduced undercut and no bump delamination down to 5 µm pitch. As a benchmark towards indium (In), on the reliability side, we evaluate the reliability of the Sn based microbumps under cryogenics conditions. In effect, a large variety of infrared detectors operate under cryogenic conditions, and no data is available about Sn microbump under cryogenic temperature. This is one of main reasons why indium is still widely used.

According to an exemplary embodiment, Cu/Ni/Sn microbumps may be developed and produced on 200 mm Si wafer mimicking different imager formats. They consist of area array of bumps, with a pitch of 10 and 5 µm, for a total chip size of a few cm$^2$. Following this, the 10 µm pitch samples are assembled onto HgCdTe substrates, which were finished by a realistic Under Bump Metallization (UBM) for such devices. We evaluate the assembly conditions and their related different failure modes. Furthermore, the generated stacks undergo 80K/293K temperature cycles and the morphology of the sample was evaluated. On the 5 µm pitch, most of the work is focused on providing 5 µm pitch Cu/Ni/Sn microbumps, which is already far beyond state of the art. Still we evaluate the assembly conditions for Si/Si stacks. This part of the work is used to validate some of the process steps to manufacture ultra-fine pitch such "bumps". Advantageously, 5 µm pitch Wafer Level Bumping with High Aspect ratio mini Sn pillars are developed. A typical showstopper to pitch scaling is the undercut process observed at the base of the microbumps. In order to circumvent the undercut issue, according to an exemplary embodiment we developed a specific process to prevent the undercut at the base of the bumps and produce high aspect ratio mini pillars which will in return ease the subsequent underfill process. With a process according to an exemplary embodiment it is possible to produce microbumps that have a width, for example of 2 µm and with a spacing of 3 µm between bumps. According to another exemplary embodiment, the microbumps may be planarized by means of a CMP technique, and may offer a within die non uniformity of for example less than 0.6 µm.

According to an exemplary embodiment, 5 µm pitch Si bumped samples may be hybridized onto Si "dummy detector" chips, which have the standard UBM metallization process. The bonding may be performed using a precision bonder FC150 with a theoretical accuracy of +/−1 µm 3 sigma post bonding. The hybridization is realized by mean of thermo compression bonding at less than 250° C. during 15 min followed by capillary underfilling. According to experiments done, the dies were bonded and underfilled successfully. Among the multiple hybridizations, some discrepancies with the alignment were noticed. Nevertheless, some submicron alignment assemblies were accomplished. On properly bonded samples, we noted that capillary underfill with 5 µm pitch bumps could be achieved without visible voids. This was confirmed by SAM and SEM microscopy. However, the junction between the bump and the UBM, may be partially complete, and this can be attributed to improper eutectic point of the solder due to Cu contamination and/or lack of Sn. The sample may not have enough pure Sn to allow for low enough temperature melting point. This means that the assembly can be further optimized by improving the respective amount of Cu, Ni and Sn.

While a 10 µm pitch process presents a rather high level of maturity in a research context, a more disruptive technique involving advanced lithography and CMP may be used to generate 5 µm samples. At 5 µm pitch, a comparison of underfill structures can be made for Iridium balls and mini-pillars. It appears clearly that the underfill glue has more space to spread in the mini micrometer pillar configuration. If we evaluate the ratio (space for underfill/complete volume between components) for the 5 µm pitch optimal structures, we could anticipate a ratio up to 87% for the mini micrometer pillar structure. This type of interconnect structure tends to prove that capillary underfill processes is still an alternative to PAUF (Pre-Applied Underfill) for fine pitch flip chip bonding.

According to a further exemplary embodiment, 200 mm Si wafers can be successfully bumped down to 10 and 5 µm pitch. In term of reliability, the 10 µm pitch Cu/Ni/Sn samples were successfully hybridized to large array HgCdTe detection circuits 1024×768 (XGA). These components followed 960 thermal cycles 80K/293K without any visible structural change, showing similar reliability response than classical indium from a thermo mechanical point of view. The 5 µm pitch material was assembled and a narrow gap of 4 µm was successfully underfilled, a specific process was used to avoid bump undercut and produce 5 µm pitch mini pillars. Despite the small gap the 5 µm pitch samples were underfill thanks to the high aspect ratio of the mini pillars. We have identified the lack of Ni barrier as main failure mode during assembly. This can be corrected by electroplating optimization.

Advantageously, according to an embodiment, we show that the Sn based microbump technology has the potential to address both the extreme pitch scaling and reliability constrains of such high density interconnections of heterogeneous material, operating under extreme temperature variations. Using wafer scale bumping processes according to an embodiment, a dramatic increase in interconnect density can be achieved for hybrid IR sensors.

Still further exemplary embodiments for fabricating a substrate with an array of micrometer pillar structures or micro bump structures will be described in the following: according to an exemplary fabrication process, the processing scheme involves formation of two bumps fabricated at a 200 mm Fab. The first peripheral bumps rows are there to facilitate the underfill flip chip process. These bumps are approximately 1-3 µm depending on the bump pitch and thickness. The process starts with a dielectric and TiW/Cu seed layer. It is possible to use two different approaches for metal 1 bump. In a first case, a thick resist is spin coated and patterned. Metal 1 bumps are then electroplated. In second case, a thick layer of Al is deposited. Al is then etched to form the bumps. For finer pitches a subsequent process is used due to restriction of total bump height. While with the use of the first process, the same seed layer can be used for formation of metal 2 bumps. A thick 7 µm resist is spin coated and patterned. Metal 2 bump are electroplated in Nexx stratus tool. The bump stack is Cu/Ni/Sn and its total thickness varies as a function of bump pitch. After the plating the resist is stripped and seed etch is done. First a wet copper etchant is used to remove the Cu seed followed by wet etch to remove the TiW seed. Advantageously, the Sn based microbump technology has the potential to be used for heterogeneous integration of HgCdTe detection circuits onto Si ROIC, operating in extreme cryogenic conditions, moving down to 5 µm pitch.

While the disclosure has been illustrated and described in detail in the drawings and foregoing description, such illustration and description are to be considered illustrative or exemplary and not restrictive. The disclosure is not limited to the disclosed embodiments. Variations to the disclosed embodiments can be understood and effected by those skilled in the art in practicing the claimed disclosure, from a study of the drawings, the disclosure and the appended claims.

All references cited herein are incorporated herein by reference in their entirety. To the extent publications and patents or patent applications incorporated by reference contradict the disclosure contained in the specification, the specification is intended to supersede and/or take precedence over any such contradictory material.

Unless otherwise defined, all terms (including technical and scientific terms) are to be given their ordinary and customary meaning to a person of ordinary skill in the art, and are not to be limited to a special or customized meaning unless expressly so defined herein. It should be noted that the use of particular terminology when describing certain features or aspects of the disclosure should not be taken to imply that the terminology is being re-defined herein to be restricted to include any specific characteristics of the features or aspects of the disclosure with which that terminology is associated. Terms and phrases used in this application, and variations thereof, especially in the appended claims, unless otherwise expressly stated, should be construed as open ended as opposed to limiting. As examples of the foregoing, the term 'including' should be read to mean 'including, without limitation,' 'including but not limited to,' or the like; the term 'comprising' as used herein is synonymous with 'including,' 'containing,' or 'characterized by,' and is inclusive or open-ended and does not exclude additional, unrecited elements or method steps; the term 'having' should be interpreted as 'having at least;' the term 'includes' should be interpreted as 'includes but is not limited to;' the term 'example' is used to provide exemplary instances of the item in discussion, not an exhaustive or limiting list thereof; adjectives such as 'known', 'normal', 'standard', and terms of similar meaning should not be construed as limiting the item described to a given time period or to an item available as of a given time, but instead should be read to encompass known, normal, or standard technologies that may be available or known now or at any time in the future; and use of terms like 'preferably,' 'preferred,' 'desired,' or 'desirable,' and words of similar meaning should not be understood as implying that certain features are critical, essential, or even important to the structure or function of the invention, but instead as merely intended to highlight alternative or additional features that may or may not be utilized in a particular embodiment of the invention. Likewise, a group of items linked with the conjunction 'and' should not be read as requiring that each and every one of those items be present in the grouping, but rather should be read as 'and/or' unless expressly stated otherwise. Similarly, a group of items linked with the conjunction 'or' should not be read as requiring mutual exclusivity among that group, but rather should be read as 'and/or' unless expressly stated otherwise.

Where a range of values is provided, it is understood that the upper and lower limit, and each intervening value between the upper and lower limit of the range is encompassed within the embodiments.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity. The indefinite article "a" or "an" does not exclude a plurality. A single processor or other unit may fulfill the functions of several items recited in the claims. The mere fact that certain measures are recited in mutually different dependent claims does not indicate that a combination of these measures cannot be used to advantage. Any reference signs in the claims should not be construed as limiting the scope.

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

All numbers expressing quantities of ingredients, reaction conditions, and so forth used in the specification are to be understood as being modified in all instances by the term 'about.' Accordingly, unless indicated to the contrary, the numerical parameters set forth herein are approximations that may vary depending upon the desired properties sought to be obtained. At the very least, and not as an attempt to limit the application of the doctrine of equivalents to the scope of any claims in any application claiming priority to the present application, each numerical parameter should be construed in light of the number of significant digits and ordinary rounding approaches.

Furthermore, although the foregoing has been described in some detail by way of illustrations and examples for purposes of clarity and understanding, it is apparent to those skilled in the art that certain changes and modifications may be practiced. Therefore, the description and examples should not be construed as limiting the scope of the invention to the specific embodiments and examples described herein, but rather to also cover all modification and alternatives coming with the true scope and spirit of the invention.

What is claimed is:

1. A substrate structure for use in a semiconductor device, comprising:
    an array of copper pillar structures extending over one or more lines of a first direction and/or one or more lines of a second direction on top of a substrate layer;
    wherein the copper pillar structures have a substantially cylindrical shape with a width of from 1 μm to 3 μm and a height of from 2 μm to 9 μm and an aspect height/width ratio of from 2 to 3;
    wherein the copper pillar structures are separated in the first direction and/or the second direction by a pitch, defined from a center of a first pillar structure to a center of a second pillar structure, of from 4 μm to 5 μm; and
    wherein each copper pillar structure has an oxide layer or a nitride layer on its surface and in contact with its base.

2. The substrate structure of claim 1, wherein the base comprises a first TiW, Ti or TiN layer with a thickness of about 30 nm and a second Cu seed layer with a thickness of about 100 nm.

3. The substrate structure of claim 1, wherein the oxide layer or the nitride layer on a surface of the substrate layer has a thickness of from 100 nm to 300 nm.

4. The substrate structure of claim 1, wherein each copper pillar structure comprises an undercut region at the base which is smaller than 100 nm.

5. The substrate structure of claim 1, wherein each base has a form of an extended base which is wider than a top part of the pillar.

6. The substrate structure of claim 1, wherein a difference in height between the copper pillar structures of the array is less than 0.5 µm.

7. The substrate structure of claim 1, wherein each copper pillar structure further comprises a solder material layer and a barrier material layer, wherein the barrier material layer is situated between the solder material layer and a copper pillar of the copper pillar structure, thereby forming an array of micro bump structures.

8. The substrate structure of claim 7, wherein the solder material layer comprises at least 85% Sn or In, and the barrier material layer is Ni, Co, or Pd.

9. The substrate structure of claim 7, wherein the micro bump structures have a substantially cylindrical or cylindrical-like shape with a width of from 1 µm to 3 µm and a height of from 2 µm to 9 µm and an aspect height/width ratio of from 2 to 3.

10. The substrate structure of claim 7, wherein the copper pillar structures have a height of from 1.5 µm to 7 µm, wherein the barrier material layer has a height of 0.5 µm, and wherein the solder material layer has a height of from 1.5 µm to 7 µm.

11. The substrate structure of claim 1, which is a component of an integrated circuit, a semiconductor wafer or an electronic device.

12. The substrate structure of claim 1, wherein the copper pillar structures comprise a copper plate.

13. The substrate structure of claim 1, wherein the copper pillar structures are electroplated.

* * * * *

UNITED STATES PATENT AND TRADEMARK OFFICE
CERTIFICATE OF CORRECTION

PATENT NO. : 10,128,123 B2
APPLICATION NO. : 15/159172
DATED : November 13, 2018
INVENTOR(S) : Bivragh Majeed et al.

It is certified that error appears in the above-identified patent and that said Letters Patent is hereby corrected as shown below:

Page 1 of 1

In the Specification

In Column 9 at Line 37, Change "Iridium" to --Indium--.

Signed and Sealed this
Twenty-sixth Day of February, 2019

Andrei Iancu
*Director of the United States Patent and Trademark Office*